United States Patent
Miao et al.

(10) Patent No.: US 12,238,889 B1
(45) Date of Patent: Feb. 25, 2025

(54) CABLE MANAGEMENT ASSEMBLY AND CABLE MANAGEMENT METHOD

(71) Applicants: SQ TECHNOLOGY (SHANGHAI) CORPORATION, Shanghai (CN); INVENTEC CORPORATION, Taipei (TW)

(72) Inventors: Xin-Jie Miao, Shanghai (CN); Xiao-Shuang Li, Shanghai (CN)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 43 days.

(21) Appl. No.: 18/370,403

(22) Filed: Sep. 20, 2023

(30) Foreign Application Priority Data

Aug. 10, 2023 (CN) .......................... 202311008897.8

(51) Int. Cl.
*H05K 7/14* (2006.01)
(52) U.S. Cl.
CPC ................................. *H05K 7/1491* (2013.01)
(58) Field of Classification Search
CPC ................................................... H05K 7/1491
See application file for complete search history.

(56) References Cited

U.S. PATENT DOCUMENTS

| 11,855,432 | B2* | 12/2023 | Tsorng | ................... F16L 3/2235 |
| 11,937,399 | B2* | 3/2024 | Zhang | ................. H05K 7/20772 |
| 2012/0223192 | A1* | 9/2012 | Donaldson | ................ F16L 3/24 248/68.1 |
| 2023/0209762 | A1* | 6/2023 | Zhan | .................... H05K 7/1491 211/26 |

* cited by examiner

*Primary Examiner* — Anita M King (57) ABSTRACT

The present disclosure relates to a cable management assembly and a cable management method. The management assembly includes an assembly bracket and a cable management bracket. During assembly, a cable female element is mounted on the cable management bracket, the assembly bracket is mounted on a side surface of a module body facing the cable management port, and an external force is exerted on the module body to move the module body into a housing. When the module body is moved to the assembly bracket is aligned with the cable management port, the movement of the module body is stopped, and the cable management bracket is mounted on the assembly bracket through the cable management port. After the management cable bracket is mounted on the assembly bracket, the module body continues to be moved in the housing until the module body is moved to a mounting position.

15 Claims, 5 Drawing Sheets

CABLE MANAGEMENT ASSEMBLY AND CABLE MANAGEMENT METHOD

CROSS-REFERENCE TO RELATED APPLICATIONS

The present application claims priority to Chinese patent application No. 2023110088978, filed on Aug. 10, 2023, the entire content of which is incorporated herein by reference.

TECHNICAL FIELD

The present disclosure relates to the field of servers, in particular to a cable management assembly and a cable management method.

BACKGROUND

When designing a storage model of a server, a calculation module and a storage module can be distributed left and right. At this time, the calculation module and the storage module shall be connected through cables to realize transmission of data signals. In order to facilitate wiring, larger cable management ports are provided on housings of the calculation module and the storage module. However, the housings of the calculation module and the storage module have no space for arranging larger cable management ports, and the larger cable management ports will affect the structural strength, air flow, etc.

SUMMARY

Accordingly, it is necessary to provide a cable management assembly and a cable management method to address a problem that the housings of the calculation module and the storage module have no space to arrange larger cable management ports, and the larger cable management ports will affect the structural strength and air flow.

A cable management assembly includes an assembly bracket and a cable management bracket. The assembly bracket is configured to be mounted on a side surface of a module body facing a cable management port of a housing. The cable management bracket is configured to mount a cable female element, and the cable management bracket is mounted on the assembly bracket on a condition that the module body is moved into the housing until the assembly bracket is aligned with the cable management port.

In an embodiment, the cable management bracket includes a cable management bracket body. The cable management bracket body includes a first cable management plate, a second cable management plate, and a third cable management plate, and the second cable management plate and a third cable management plate are opposite to each other. Both of the second cable management plate and the third cable management plate are arranged on the same side of the first cable management plate. The first cable management plate, the second cable management plate and the third cable management plate are enclosed to form an accommodation space including a first insertion port and a cable outlet. The first insertion port is opposite to the first cable management plate. The cable outlet is arranged between the first cable management plate and the first insertion port. A side of the cable management bracket body provided with the first insertion port is configured to be mounted on the assembly bracket on a condition that the module body is moved to a position where the assembly bracket is aligned with the cable management port.

In an embodiment, opposite sides of the second cable management plate corresponding to the cable outlet each is provided with a first limiting portion. The first limiting portion extends from the second cable management plate toward the third cable management plate. The first limiting portion is configured to limit the removal of the cable female element from the cable outlet. Opposite sides of the third cable management plate corresponding to the cable outlet each is provided with a second limiting portion. The second limiting portion extends from the third cable management plate toward the second cable management plate, and the second limiting portion is configured to limit the removal of the cable female element from the cable outlet.

In an embodiment, the cable management bracket further includes an adapter plate. A side of the cable management bracket body is provided with the first insertion port is mounted on the adapter plate. The adapter plate is configured to be mounted on the assembly bracket on a condition that the module body is moved to the position where the assembly bracket is aligned with the cable management port.

In an embodiment, the cable management bracket body further includes a first mounting plate and a second mounting plate that are configured to be connected and cooperate with the adapter plate. The first mounting plate is provided on a side of the second cable management plate away from the first cable management plate, and extends from the second cable management plate in a direction away from the third cable management plate. The second mounting plate is provided on a side of the third cable management plate away from the first cable management plate, and extends from the third cable management plate in a direction away from the second cable management plate.

In an embodiment, a side of the second cable management plate away from the first cable management plate is provided with a first positioning portion. The first positioning portion includes a first positioning block. The first mounting plate is provided with a first avoidance hole. The first positioning block extends from the first avoidance hole to a side of the first mounting plate away from the second cable management plate. The adapter plate is provided with a second positioning portion configured to position and cooperate with the first positioning portion. The second positioning portion is provided with a first positioning hole configured to adapt to the first positioning block. A hole wall of the first positioning hole is provided with a first pressing portion and a second pressing portion that are opposite to each other. The first pressing portion is arc-shaped protruding toward the second pressing portion, the second pressing portion is arc-shaped protruding toward the first pressing portion, and the first pressing portion and the second pressing portion cooperate to clamp the first positioning block.

In an embodiment, a side of the third cable management plate away from the first cable management plate is provided with a third positioning portion. The third positioning portion includes a second positioning block. The second mounting plate is provided with a second avoidance hole. The second positioning block extends from the second avoidance hole to a side of the second mounting plate away from the third cable management plate. The adapter plate is provided with a fourth positioning portion configured to position and cooperate with the third positioning portion. The fourth positioning portion is provided with a second positioning hole configured to adapt to the second positioning block. A hole wall of the second positioning hole is provided with a third pressing portion and a fourth pressing portion that are opposite to each other. The third pressing portion is arc-shaped protruding toward the fourth pressing portion. The fourth pressing portion is arc-shaped protruding toward the third pressing portion, and the third pressing portion and the fourth pressing portion cooperate to clamp the second positioning block.

In an embodiment, the first mounting plate is provided with a fifth positioning portion and the adapter plate is provided with a sixth positioning portion configured to position and cooperate with the fifth positioning portion, and/or the second mounting plate is provided with a seventh positioning portion and the adapter plate is provided with an eighth positioning portion configured to position and cooperate with the seventh positioning portion.

In an embodiment, the cable management bracket is provided with a gourd hole. The adapter plate is provided with a through hole. The cable management assembly further comprises a I-shaped pin. The I-shaped pin is provided in the through hole. The I-shaped pin is configured to be arranged in the gourd hole on a condition that the module body is moved to the position where the assembly bracket is aligned with the cable management port. The cable management bracket is further provided with a first lock hole. The adapter plate is further provided with a second lock hole. The cable management assembly further includes a locking member. The locking member is configured to be provided in the first lock hole and the second lock hole on a condition that the module body is moved to the position where the assembly bracket is aligned with the cable management port.

A cable management method includes: providing the above-mentioned cable management assembly; mounting a cable female element on a cable management bracket; mounting an assembly bracket on a side surface of a module body facing a cable management port; moving the module body toward a housing, when the module body is moved into the housing until the assembly bracket is aligned with the cable management port, stopping the movement of the module body, and mounting the cable management bracket on the assembly bracket; continuing to move the module body in the housing until the module body is moved to a mounting position thereof.

During the assembly of the above-mentioned cable management assembly and the cable management method, firstly, the cable female element is mount on the cable management bracket. Next, the assembly bracket is mounted on the side of the module body facing the cable management port. Then, an external force is exerted on the module body to move the module body into the housing. When the module body is moved to the assembly bracket is aligned with the cable management port, the movement of the module body is stopped, and the cable management bracket mounted with the cable female element is mounted on the assembly bracket through the cable management port. After the cable management bracket is mounted on the assembly bracket, the module body continues to be moved in the housing until the module body is moved to the mounting position. As such, the cable management port can be provided at the rear of the module body along the moving direction, that is, the cable management port doesn't need to be aligned with the cable female element, so that the size of the cable management port can be reduced, and an influence on structural strength, air flow and the like due to the larger size of the cable management port can be avoided.

DESCRIPTION OF REFERENCE SIGNS

10. cable management assembly; 100. assembly bracket; 110. first assembly plate; 111. first lock hole; 112. gourd hole; 113. mounting groove; 120. second assembly plate; 130. third assembly plate; 140. first fixing member; 150. second fixing member; 160. receiving space; 200. cable management bracket; 210. cable management bracket body; 211. first cable management plate; 212. second cable management plate; 2121. first limiting portion; 2122. first positioning portion; 213. third cable management plate; 2131. second limiting portion; 2132. third positioning portion; 214. first mounting plate; 2141. first mounting hole; 2142. first avoidance hole; 2143. fifth positioning portion; 215. second mounting plate; 2151. second mounting hole; 2152. second avoidance hole; 216. first insertion port; 217. cable outlet; 218. accommodation space; 220. adapter plate; 221. third mounting hole; 222. fourth mounting hole; 223. second positioning portion; 2231. first pressing portion; 2232. second pressing portion; 224. fourth positioning portion; 2241. third pressing portion; 2242. fourth pressing portion; 225. sixth positioning portion; 226. second lock hole; 227. through hole; 230. first connecting member; 240. second connecting member; 250. I-shaped pin; 300. locking member; 20. cable female element; 30. housing; 31. cable management port; 40. module body.

DETAILED DESCRIPTION OF THE EMBODIMENTS

In order to make the above objectives, features and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by the specific embodiments disclosed below.

Figure 1:
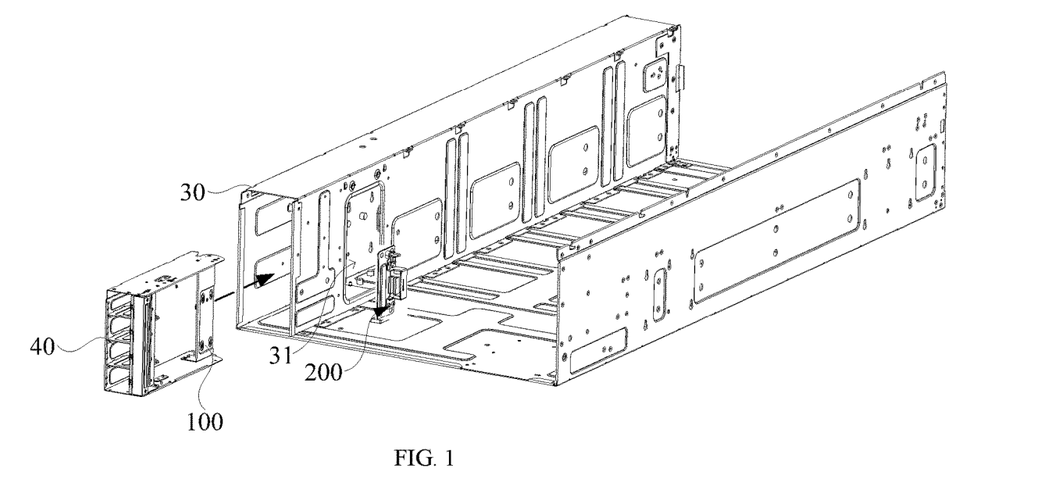
FIG. 1 is a process view of assembling a cable management assembly and a housing according to an embodiment of the present disclosure.
Figure 2:
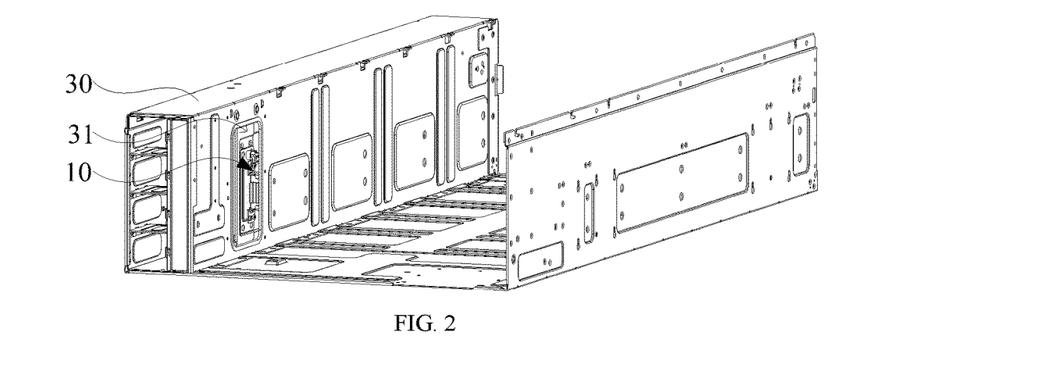
FIG. 2 is a perspective view of a cable management assembly assembled to a housing according to an embodiment of the present disclosure.
Figure 3:
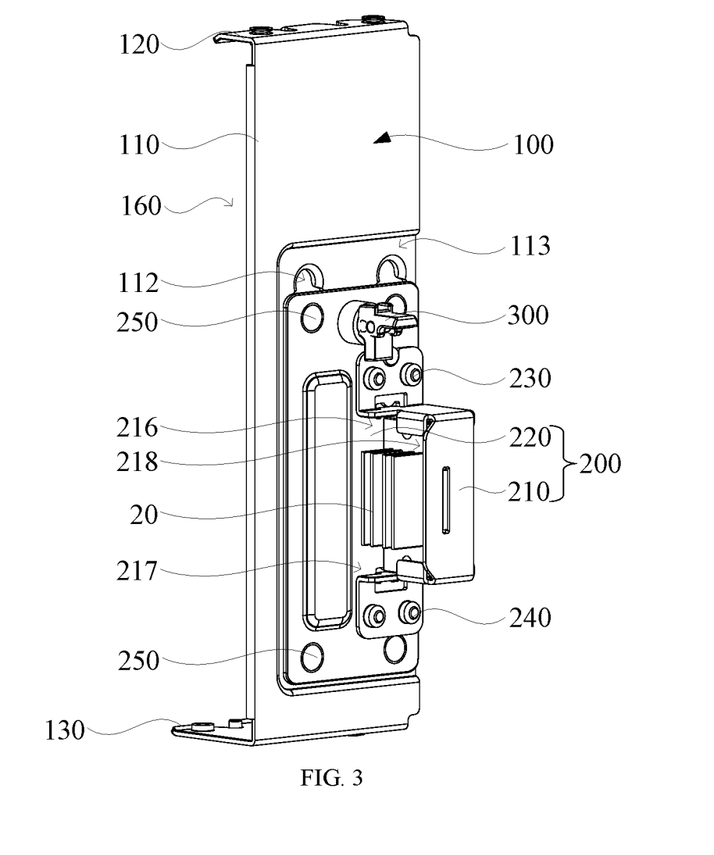
FIG. 3 is a perspective view of a cable management assembly according to an embodiment of the present disclosure.

Referring to FIG. 1, FIG. 2 and FIG. 3, FIG. 1 shows a process view of assembling a cable management assembly and a housing according to an embodiment of the present disclosure. FIG. 2 shows a perspective view of the cable management assembled in a housing according to an embodiment of the present disclosure. FIG. 3 shows a perspective view of the cable management assembly according to an embodiment of the present disclosure. A cable management assembly 10 provided according to an embodiment of the present disclosure includes an assembly bracket 100 and a cable management bracket 200. The assembly bracket 100 is configured to mount on a side surface of a module body 40 facing a cable management port 31 of a housing 30. The cable management bracket 200 is configured to mount a cable female element 20, and is mounted on the assembly bracket 100 on a condition that the module body 40 is moved into the housing 30 until the assembly bracket 100 is aligned with the cable management port 31.

It should be noted that the module body 40 may be a server body, for example, the module body 40 is a calculation module, a storage module, or the like. In other embodiments, the module body 40 may be of other types of modules, which is not limited thereto.

During the assembly of the above-mentioned cable management assembly, firstly, cable female element 20 is mounted on the cable management bracket 200. Next, the assembly bracket 100 is mounted on a side surface of the module body 40 opposite to the cable management port 31. Then, an external force is exerted on the module body 40 to move the module body 40 into the housing 100. When the module body 40 is moved to a position where the assembly bracket 100 is aligned with the cable management port 31, the movement of the module body 40 is stopped, and the cable management bracket 200 mounted with the cable female element 20 is mounted on the assembly bracket 100 through the cable management port 31. After the cable management bracket 200 is mounted on the assembly bracket 100, the module body 40 continue to be moved in the housing 30 until the module body 40 is moved to a mounting position. As such, the cable management port 31 can be provided at the rear of the module body 40 along the moving direction, that is, the cable management port 31 doesn't need to be aligned with the cable female element 20, so that the size of the cable management port 31 can be reduced, and an influence on structural strength, air flow and the like due to the larger size of the cable management port 31 can be avoided.

Figure 4:
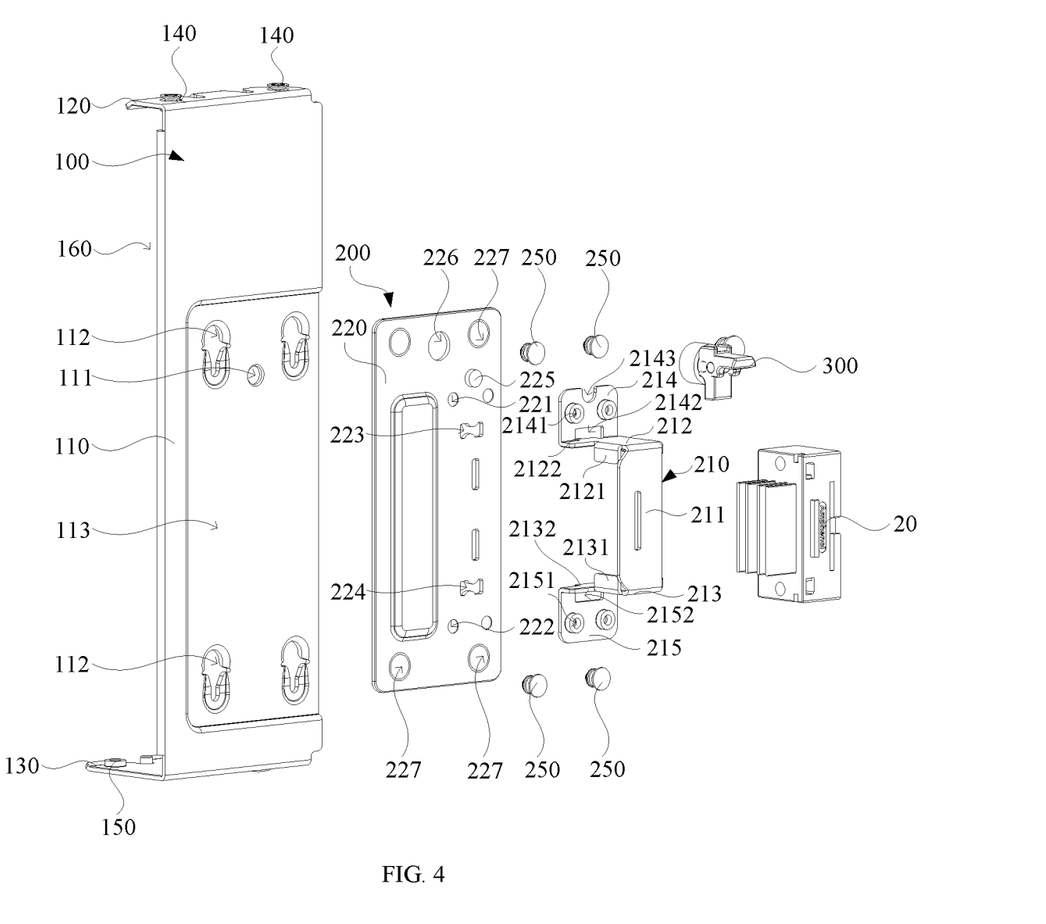
FIG. 4 is an exploded view of the cable management assembly of FIG. 3.

In an embodiment, referring to FIG. 3 and FIG. 4, the assembly bracket 100 includes a first assembly plate 110 configured to be connected to the cable management bracket 200 when the module body 40 is moved to a position where the first assembly plate 110 is aligned with the cable management port 31. As such, the first assembly plate 110 provides a mounting position for the cable management bracket 200.

Further, referring to FIG. 3 and FIG. 4, the assembly bracket 100 further includes a second assembly plate 120 and a third assembly plate 130 that are configured to be connected to the module body 40. The second assembly plate 120 and the third assembly plate 130 are provided opposite to each other and both are provided on the same side of the first assembly plate 110. The first assembly plate 110, the second assembly plate 120 and the third assembly plate 130 are enclosed to form a receiving space 160. During assembly, a side of the module body 40 facing the cable management port 31 is accommodated in the receiving space 160. The first assembly plate 110 is provided on the side of the module body 40 facing the cable management port 31. The second assembly plate 120 and the third assembly plate 130 are provided on the top and bottom of the module body 40, respectively.

Alternatively, referring to FIG. 4, the second assembly plate 120 is provided with a first fixing hole, and the third assembly plate 130 is provided with a second fixing hole. The cable management assembly 10 further includes a first fixing member 140 and a second fixing member 150. The first fixing member 140 is arranged in the first fixing hole, and the second fixing member 150 is arranged in the second fixing hole. The first fixing member 140 and the second fixing member 150 are screws. As such, the second assembly plate 120 and the third assembly plate 130 can be mounted on the top and bottom of the module body 40 through first fixing member 140 and the second fixing member 150, respectively, so that the assembly bracket 100 can be mounted on the module body 40, solidly and reliably.

Figure 5:
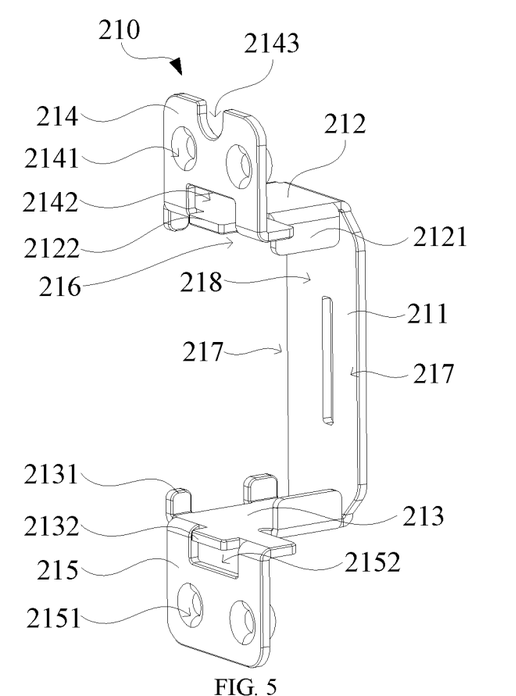
FIG. 5 is a perspective view of a cable management bracket of FIG. 4.

In an embodiment, referring to FIG. 3, FIG. 4, and FIG. 5, the cable management bracket 200 includes a cable management bracket body 210. The cable management bracket body 210 includes a first cable management plate 211, a second cable management plate 212, and a third cable management plate 213. The second cable management plate 212 and a third cable management plate 213 are opposite to each other. Both of the second cable management plate 212 and the third cable management plate 213 are arranged on the same side surface of the first cable management plate 211. The first cable management plate 211, the second cable management plate 212, and the third cable management plate 213 are enclosed to form an accommodation space 218 including a first insertion port 216 and a cable outlet 217. The first insertion port 216 is opposite to the first cable management plate 211. The cable outlet 217 is arranged between the first cable management plate 211 and the first insertion port 216. A side of the cable management bracket body 210 provided with the first insertion port 216 is configured to be mounted on the assembly bracket 100 on a condition that the module body 40 moves to the position where the assembly bracket 100 is aligned with the cable management port 31. During assembly, the cable female element 20 is placed in the accommodation space 218 through the first insertion port 216. A cable electrically connected to the cable female element 20 may pass out from the accommodation space 218 to the outside of the cable management bracket 200 through the cable outlet 217. As such, the cable female element 20 can be mounted on the cable management bracket body 210 without any auxiliary tools, which helps to improve the mounting efficiency.

Further, referring to FIG. 4 and FIG. 5, opposite sides of the second cable management plate 212 corresponding to the cable outlet 217 each is provided with a first limiting portion 2121. The first limiting portion 2121 extends toward the third cable management plate 213. The first limiting portion 2121 is configured to limit the removal of cable female element 20 from the cable outlet 217. Opposite sides of the cable outlet 217 corresponding to the third cable management plate 213 each is provided with a second limiting portion 2131. The second limiting portion 2131 extends toward the second cable management plate 212. The second limiting portion 2131 is configured to limit the removal of the cable female element head 20 from the cable outlet 217. As such, the first limiting portion 2121 and the second limiting portion 2131 can limit the cable female element 20 to prevent the removal of the cable female element 20 from the cable outlet 217, and ensure that the cable female element 20 is mounted on the cable management bracket body 210, stably and reliably.

Alternatively, referring to FIG. 4 and FIG. 5, the first limit portion 2121 is a first limit plate. The first limit plate is bent from a side portion of the second line plate 212 toward the third cable management plate 213. The second limit portion 2131 is a second limit plate. The second limit plate is bent from a side portion of the third cable management plate 213 toward the second cable management plate 212.

In an embodiment, referring to FIG. 3 and FIG. 4, the cable management bracket 200 further includes an adapter plate 220. A side of the cable management bracket body 210 provided with the first insertion port 216 is mounted on the adapter plate 220. The adapter plate 220 is configured to be mounted on the assembly bracket 100 on a condition that the module body 40 is moved to the position where the assembly bracket 100 is aligned with the cable management port 31. During assembly, the cable female element 20 is placed in the accommodation space 218 through the first insertion port 216. Then, the cable management bracket body 210 mounted with the cable female element 20 is mounted on the adapter plate 220, so that the adapter plate 220 limit the cable female element 20 to prevent the removal of adapter plate 220 from the first insertion port 216. The adapter plate 220 is mounted on the assembly bracket 100 when the module body 40 is moved to the position where the assembly bracket 100 is aligned with the cable management port 31.

Further, referring to FIG. 3 and FIG. 4, the assembly bracket 100 is provided with a mounting groove 113. The adapter plate 220 is configured to be mounted at the groove bottom of the mounting groove 113 on a condition that the module body 40 is moved to the position the assembly bracket 100 is aligned with the cable management port 31. Specifically, the mounting groove 113 is provided on the first assembly plate 110. As such, the groove wall of the mounting groove 113 can limit the adapter plate 220, and help to reduce the thickness of the cable management assembly 10.

Further, referring to FIG. 3, FIG. 4 and FIG. 5, the cable management bracket body 210 further includes a first mounting plate 214 and a second mounting plate 215 that are configured to be connected and cooperate with the adapter plate 220. The first mounting plate 214 is provided on a side of the second cable management plate 212 away from the first cable management plate 211, and extends from the second cable management plate 212 in a direction away from the third cable management plate 213. The second mounting plate 215 is provided on a side of the third cable management plate 213 away from the first cable management plate 211, and extends from the third cable management plate 213 in a direction away from the second cable management plate 212. During assembly, after the cable female element 20 is placed in the accommodation space 218, the first mounting plate 214 and the second mounting plate 215 are mounted on the adapter plate 220, respectively, so that the connection between the cable management bracket body 210 and the adapter plate 220 can be realized.

Alternatively, referring to FIG. 3, FIG. 4 and FIG. 5, the first mounting plate 214 is provided with a first mounting hole 2141. The second mounting plate 215 is provided with a second mounting hole 2151. The adapter plate 220 is provided with a third mounting hole 221 corresponding to the first mounting hole 2141. The adapter plate 220 is further provided with a fourth mounting hole 222 corresponding to the second mounting hole 2151.

The cable management bracket 200 further includes a first connecting member 230 and a second connecting member 240. The first connecting member 230 is arranged in the first mounting hole 2141 and the third mounting hole 221. The second connecting member 240 is arranged in the second mounting hole 2151 and the fourth mounting hole 222. As such, the cable management bracket body 210 can be mounted on the adapter plate 220, detachably. Both of the first connecting member 230 and the second connecting member 240 may be screws.

In other embodiments, the first mounting plate 214 is provided with a first engaging member, and the second mounting plate 215 is provided with a second engaging member. The adapter plate 220 is provided with a third engaging member corresponding to the first engaging member. The adapter plate 220 is provided with a fourth engaging member corresponding to the second engaging member. The first engaging member is engaged with the third engaging member, and the second engaging member is engaged with the fourth engaging member.

In an embodiment, referring to FIG. 3, FIG. 4, and FIG. 5, a side of the second cable management plate 212 away from the first cable management plate 211 is provided with a first positioning portion 2122. The adapter plate 220 is provided with a second positioning portion 223 configured to position and cooperate with the first positioning portion 2122. A side of the third cable management plate 213 away from the first cable management plate 211 is provided with a third positioning portion 2132. The adapter plate 220 is provided with a fourth positioning portion 224 configured to position and cooperate with the third positioning portion 2132. After the cable female element 20 is mounted on the cable management bracket body 210, the adapter plate 220 is placed on a side of the cable management bracket body 210 provided with the first insertion port 216. The first positioning portion 2122 position and cooperate with the second positioning portion 223. The third positioning portion 2132 position and cooperate with the fourth positioning portion 224, which enables the first mounting hole 2141 to be aligned with the third mounting hole 221 and the second mounting hole 2151 is aligned with the fourth mounting hole 222, so as to mount the first mounting plate 214 and the second mounting plate 215 on the adapter plate 220, quickly, to improve the mounting efficiency. In an embodiment, a plurality of first mounting holes 2141, a plurality of third mounting holes 221, a plurality of second mounting holes 2151 and a plurality of fourth mounting holes 222 are provided. The first mounting holes 2141 are in one-to-one correspondence with the third mounting holes 221. The second mounting holes 2151 are in one-to-one correspondence with the fourth mounting holes 222.

In one embodiment, referring to FIG. 3 and FIG. 4, the first positioning portion 2122 includes a first positioning block 311. The first mounting plate 214 is provided with a first avoidance hole 2142. The first positioning block extends from the first avoidance hole 2142 to a side of the first mounting plate 214 away from the second cable management plate 212. The second positioning portion 223 is provided with a first positioning hole configured to adapt to the first positioning block. After the cable female element 20 is mounted on the cable management bracket body 210, the adapter plate 220 is placed on a side of the cable management bracket body 210 provided with the first insertion port 216. The first positioning block is inserted into the first positioning hole, which enables the first mounting hole 2141 to be aligned with the third mounting hole 221, so that the first connecting member 230 is inserted into the first mounting hole 2141 and the third mounting hole 221, thereby mounting the first mounting plate 214 on the adapter plate 220, quickly.

Further, referring to FIG. 3 and FIG. 4, a hole wall of the first positioning hole is provided with a first pressing portion 2231 and a second pressing portion 2232 that are opposite to each other. The first pressing portion 2231 and the second pressing portion 2232 cooperate to clamp the first positioning block. As such, the positioning effect can be better realized.

Further, referring to FIG. 4, the first pressing portion 2231 is arc-shaped protruding toward the second pressing portion 2232. The second pressing portion 2232 is arc-shaped protruding toward the first pressing portion 2231. As such, when the first positioning block is arranged between the arc-shaped first pressing portion 2231 and the arc-shaped second pressing portion 2232, the arc-shaped first pressing portion 2231 and the arc-shaped second pressing portion 2232 have small contact area with the first positioning block, respectively, so that the first positioning block can be inserted into the first positioning hole and pulled out from the first positioning hole with a small force.

In an embodiment, referring to FIG. 3 and FIG. 4, the third positioning portion 2132 includes a second positioning block. The second mounting plate 215 is provided with a second avoidance hole 2152. The second positioning block extends from the second avoidance hole 2152 to a side of the second mounting plate 215 away from the third cable management plate 213. The fourth positioning portion 224 is provided with a second positioning hole configured to adapt to the second positioning block. After the cable female element 20 is placed on the cable management bracket body 210, the adapter plate 220 is placed on a side of the cable management bracket body 210 provided with the first insertion port 216. The second positioning block is inserted into the second positioning hole, which enables the second mounting hole 2151 to be aligned with the fourth mounting hole 222, so that the second connecting member 240 is inserted into the second mounting hole 2151 and the fourth mounting hole 222, thereby mounting the second mounting plate 215 on the adapter plate 220, quickly.

Figure 6:
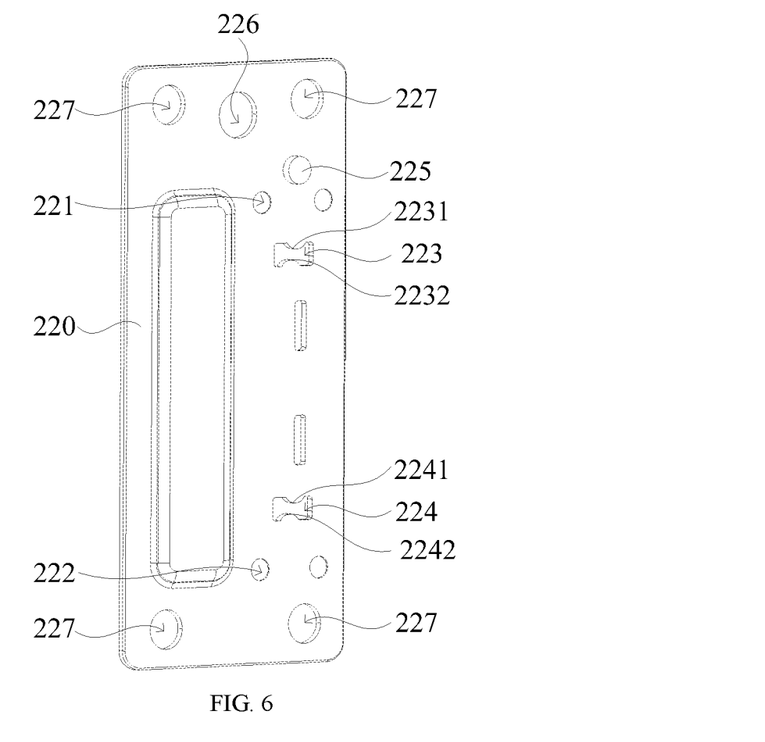
FIG. 6 is a perspective view of an adapter plate of FIG. 4.

Further, referring to FIG. 3, FIG. 4 and FIG. 6, a hole wall of the second positioning hole is provided with a third pressing portion 2241 and a fourth pressing portion 2242 that are opposite to each other. The third pressing portion 2241 and the fourth pressing portion 2242 cooperate to clamp the second positioning block. As such, the positioning effect can be better realized.

Further, referring to FIG. 3, FIG. 4, and FIG. 6, the third pressing portion 2241 is arc-shaped protruding toward the fourth pressing portion 2242, and the fourth pressing portion 2242 is arc-shaped protruding toward the third pressing portion 2241. As such, when the second positioning block is arranged between the arc-shaped third pressing portion 2241 and the arc-shaped fourth pressing portion 2242, the third pressing portion 2241 and the fourth pressing portion 2242 have small contact area with the second positioning block, respectively, so that the second positioning block can be inserted into the second positioning hole and pulled out from the second positioning hole with a small force.

In an embodiment, referring to FIG. 3 and FIG. 4, the first mounting plate 214 is provided with a fifth positioning portion 2143, and the adapter plate 220 is provided with a sixth positioning portion 225 configured to position and cooperate with the fifth positioning portion 2143. And/or, the second mounting plate 215 is provided with a seventh positioning portion (not shown in the figure), and the adapter plate 220 is provided with an eighth positioning portion (not shown in the figure) configured to position and cooperate with the seventh positioning portion. As such, the cable management bracket body 210 is mounted on the adapter plate 220, conveniently and quickly.

Alternatively, the fifth positioning portion 2143 is provided with a first positioning groove, and the sixth positioning portion 225 is provided with a first positioning column. The first positioning column is protruded on a side surface of the adapter plate 220 toward the cable management bracket body 210. The first positioning column is arranged in the first positioning groove, and is positioned and cooperates with the first positioning groove.

Alternatively, the seventh positioning portion is provided with a second positioning groove. The eighth positioning portion includes a second positioning column. The second positioning column is protruded on the side surface of the adapter plate 220 toward the cable management bracket body 210. The second positioning column is arranged in the second positioning groove, and is positioned and cooperates with the second positioning groove.

In an embodiment, referring to FIG. 3 and FIG. 4, the assembly bracket 100 is provided with a gourd hole 112, and the adapter plate 220 is provided with a through hole 227. Specifically, the gourd hole 112 is provided at the groove bottom of the mounting groove 113. The cable management assembly 10 further includes a I-shaped pin 250. The I-shaped pin 250 is provided in the through hole 227, and the I-shaped pin 250 is configured to be arranged in the gourd hole 112 on a condition that the module body 40 is moved to the position where the assembly bracket 100 is aligned with the cable management port 31. When the module body 40 is moved to the position where the assembly bracket 100 is aligned with the cable management port 31, the movement of the module body 40 is stopped, and the I-shaped pin 250 is inserted into the gourd hole 112, so that the adapter plate 220 can be mounted on the assembly bracket 100. As such, the adapter plate 220 can be mounted on the assembly bracket 100 without any auxiliary tools, thereby improving mounting efficiency.

It should be noted that the number of the gourd hole 112, through hole 227 and I-shaped pin 250 may be provided according to the actual demand, and is not specifically limited herein.

In an embodiment, four through holes 227 and four I-shaped pins 250 are provided. Four through holes 227 are arranged at four corners of the square adapter plate 220, respectively. The four I-shaped pins 250 are arranged in the four through holes 227 in one-to-one correspondence, respectively. Correspondingly, four gourd holes 112 are also provided, and the four gourd holes 112 are in one-to-one correspondence with the four through holes 227, respectively.

Further, referring to FIG. 3 and FIG. 4, the assembly bracket 100 is further provided with a first lock hole 111, and the adapter plate 220 is further provided with a second lock hole 226. The cable management assembly 10 further includes a locking member 300. The locking member 300 is configured to be provided in the first lock hole 111 and the second lock hole 226 when the module body 40 is moved to the position where the assembly bracket 100 is aligned with the cable management port 31. After the I-shaped pin 250 is mounted in the gourd hole 112, the locking member 300 is mounted in the first lock hole 111 and the second lock hole 226, so that the adapter plate 220 cannot be moved relative to the assembly bracket 100.

Alternatively, the locking member 300 may be a plunger latch. In other embodiments, the locking member 300 may be a snapping member, which is not limited thereto.

According to an embodiment of the present disclosure, a cable management method is provided, which includes following steps.

S10. The cable female element 20 is mounted on a cable management bracket 200.

S20. The assembly bracket 100 is mounted on a side surface of the module body 40 facing a cable management port 31.

S30. The module body 40 is moved in a housing 30, when the module body 40 is moved in the housing 30 to the position where the assembly bracket 100 is aligned with the cable management port 31, the movement of the module body 40 is stopped, and the cable management bracket 200 is mounted on the assembly bracket 100.

S40. The module body 40 continues to be moved in the housing 30 until the module body 40 is moved to the mounting position.

As such, the cable management port 31 can be arranged at the rear of the module body 40 in the moving direction thereof by adopting the above-mentioned cable management method, that is, the cable management port 31 doesn't need to be provided to the position aligned with the cable female element 20, so that the size of the cable management port 31 can be reduced, and an influence on structural strength, air flow and the like due to the larger size of the cable management port 31 can be avoided.

In step S10, the following steps are further included.

S11. the cable female element 20 is mounted on the cable management bracket body 210.

S12. the cable management bracket body 210 mounted with the cable female element 20 is mounted on the adapter plate 220.

As such, the adapter plate 220 limits the cable female element 20 to prevent the removal of the cable female element 20 from the first insertion port 216. When after the module body 40 is moved to the position where the assembly bracket 100 is aligned with the cable management port 31, the adapter plate 220 is mounted on the assembly bracket 100.

In step S30, the following steps are further included.

S31. When the module body 40 is moved to the position where the assembly bracket 100 aligned with the cable management port 31, the movement of the module body 40 is stopped, and the adapter plate 220 is mounted on the assembly bracket 100.

Specifically, the I-shaped pin 250 mounted on the adapter plate 220 is arranged in the gourd hole 112, then the locking member 300 is used to lock the assembling bracket 100 and the adapter plate 220.

In the description of the present disclosure, it should be understood that if there are terms "center", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. orientation or position relationship indicated by the terms are based on the orientation or position relationship shown in the accompanying drawings and are merely intended to facilitate the description of the present disclosure and simplify the description, rather than indicating or implying that the indicated device or element must have a particular orientation or be constructed and operated in a particular orientation, and therefore are not to be interpreted as limiting the present disclosure.

In addition, if there are terms "first" and "second", the terms "first" and "second" are used for descriptive purposes only, which cannot be construed as indicating or implying a relative importance, or implicitly specifying the number of the indicated technical features. Therefore, the features defined with "first" and "second" may explicitly or implicitly include at least one of the features. In the description of the present disclosure, if there are terms "plurality", "plurality" means at least two, such as two, three, etc., unless otherwise specifically defined.

In this disclosure, unless otherwise expressly specified and limited, the terms "installation," "connection," "connection," "fixation," etc. shall be understood in a broad sense. In the present disclosure, unless otherwise explicitly specified and defined, the terms "mounted", "coupled", "connected" and "fixed" should be understood in a broad sense, such as, it can be a fixed connection, or a detachable connection, or integrated; it can be a mechanical connection, or an electrical connection; it can be a direct connection, an indirect connection through an intermediate medium, it can be an internal connection between two elements, or an interaction between two elements, unless otherwise explicitly defined. For those who skill in the art, the specific meaning of the aforementioned terms in the present disclosure can be understood according to specific situations.

Each of the technical features of the above-mentioned embodiments may be combined arbitrarily. To simplify the description, not all the possible combinations of each of the technical features in the above embodiments are described. However, all of the combinations of these technical features should be considered as within the scope of this disclosure, as long as such combinations do not contradict with each other.

The above embodiments merely illustrate several embodiments of the present disclosure, and the description thereof is specific and detailed, but it shall not be constructed as limiting the scope of the present disclosure. It should be noted that a plurality of variations and modifications may be made by those skilled in the art without departing from the scope of this disclosure, which are all within the scope of protection of this disclosure. Therefore, the protection scope of this disclosure shall be subject to the appended claims.

What is claimed is:

1. A cable management assembly, comprising:
   an assembly bracket, the assembly bracket configured to be mounted on a side surface of a module body facing a cable management port of a housing; and
   a cable management bracket, the cable management bracket configured to mount a cable female element, and the cable management bracket being mounted on the assembly bracket on a condition that the module body is moved into the housing until the assembly bracket is aligned with the cable management port.

2. The cable management assembly according to claim 1, wherein the cable management bracket comprises a cable management bracket body, the cable management bracket body comprises a first cable management plate, a second cable management plate, and a third cable management plate, the second cable management plate and a third cable management plate are opposite to each other, both of the second cable management plate and the third cable management plate are arranged on the same side of the first cable management plate, the first cable management plate, the second cable management plate and the third cable management plate are enclosed to form an accommodation space comprising a first insertion port and a cable outlet, the first insertion port is opposite to the first cable management plate, the cable outlet is arranged between the first cable management plate and the first insertion port, and a side of the cable management bracket body provided with the first insertion port is configured to be mounted on the assembly bracket on a condition that the module body is moved to a position where the assembly bracket is aligned with the cable management port.

3. The cable management assembly according to claim 2, wherein opposite sides of the second cable management plate corresponding to the cable outlet each is provided with a first limiting portion, the first limiting portion extends from the second cable management plate toward the third cable management plate, and the first limiting portion is configured to limit the removal of the cable female element from the cable outlet.

4. The cable management assembly according to claim 2, wherein opposite sides of the third cable management plate corresponding to the cable outlet each is provided with a second limiting portion, the second limiting portion extends from the third cable management plate toward the second cable management plate, and the second limiting portion is configured to limit the removal of the cable female element from the cable outlet.

5. The cable management assembly according to claim 2, wherein the cable management bracket further comprises an adapter plate, a side of the cable management bracket body provided with the first insertion port is mounted on the adapter plate, and the adapter plate is configured to be mounted on the assembly bracket on a condition that the module body is moved to the position where the assembly bracket is aligned with the cable management port.

6. The cable management assembly according to claim 5, wherein the cable management bracket body further comprises a first mounting plate and a second mounting plate that are configured to be connected and cooperate with the adapter plate, the first mounting plate is provided on a side of the second cable management plate away from the first cable management plate, and extends from the second cable management plate in a direction away from the third cable management plate, the second mounting plate is provided on a side of the third cable management plate away from the first cable management plate, and extends from the third cable management plate in a direction away from the second cable management plate.

7. The cable management assembly according to claim 6, wherein a side of the second cable management plate away from the first cable management plate is provided with a first positioning portion, the first positioning portion comprises a first positioning block, the first mounting plate is provided with a first avoidance hole, the first positioning block extends from the first avoidance hole to a side of the first mounting plate away from the second cable management plate, the adapter plate is provided with a second positioning portion configured to position and cooperate with the first positioning portion, and the second positioning portion is provided with a first positioning hole configured to adapt to the first positioning block.

8. The cable management assembly according to claim 7, wherein a hole wall of the first positioning hole is provided with a first pressing portion and a second pressing portion that are opposite to each other, the first pressing portion is arc-shaped protruding toward the second pressing portion, the second pressing portion is arc-shaped protruding toward the first pressing portion, and the first pressing portion and the second pressing portion cooperate to clamp the first positioning block.

9. The cable management assembly according to claim 6, wherein a side of the third cable management plate away from the first cable management plate is provided with a third positioning portion, the third positioning portion comprises a second positioning block, the second mounting plate is provided with a second avoidance hole, the second positioning block extends from the second avoidance hole to a side of the second mounting plate away from the third cable management plate, the adapter plate is provided with a fourth positioning portion configured to position and cooperate with the third positioning portion, and the fourth positioning portion is provided with a second positioning hole configured to adapt to the second positioning block.

10. The cable management assembly according to claim 9, wherein a hole wall of the second positioning hole is provided with a third pressing portion and a fourth pressing portion that are opposite to each other, the third pressing portion is arc-shaped protruding toward the fourth pressing portion, the fourth pressing portion is arc-shaped toward the third pressing portion, and the third pressing portion and the fourth pressing portion cooperate to clamp the second positioning block.

11. The cable management assembly according to claim 6, wherein the first mounting plate is provided with a fifth positioning portion, the adapter plate is provided with a sixth positioning portion configured to position and cooperate with the fifth positioning portion.

12. The cable management assembly according to claim 6, wherein the second mounting plate is provided with a seventh positioning portion, and the adapter plate is provided with an eighth positioning portion configured to position and cooperate with the seventh positioning portion.

13. The cable management assembly according to claim 4, wherein the cable management bracket is provided with a gourd hole, the adapter plate is provided with a through hole, the cable management assembly further comprises a I-shaped pin, the I-shaped pin is provided in the through hole, the I-shaped pin is configured to be arranged in the gourd hole on a condition that the module body is moved to the position where the assembly bracket is aligned with the cable management port.

14. The cable management assembly according to claim 4, wherein the cable management bracket is further provided with a first lock hole, the adapter plate is further provided with a second lock hole, the cable management assembly further comprises a locking member, the locking member is configured to be provided in the first lock hole and the second lock hole on a condition that the module body is moved to the position where the assembly bracket is aligned with the cable management port.

15. A cable management method, comprising:
providing the cable management assembly according to claim 1;
mounting the cable female element on the cable management bracket;
mounting an assembly bracket on a side surface of a module body facing a cable management port;
moving the module body toward the housing, stopping the movement of the module body on a condition that the module body is moved into the housing until the assembly bracket is aligned with the cable management port, and mounting the cable management bracket on the assembly bracket;
continuing to move the module body in the housing until the module body is moved to a mounting position thereof.

* * * * *